United States Patent [19]

Nguyen

[11] Patent Number: 5,982,693
[45] Date of Patent: Nov. 9, 1999

[54] SENSE AMPLIFIER WITH IMPROVED BIT LINE INITIALIZATION

[75] Inventor: Chinh D. Nguyen, San Jose, Calif.

[73] Assignee: Programmable Microelectronics Corporation, San Jose, Calif.

[21] Appl. No.: 08/987,796

[22] Filed: Dec. 10, 1997

[51] Int. Cl.$^6$ .................................................... G11C 7/02
[52] U.S. Cl. .......................................... 365/208; 365/207
[58] Field of Search ...................................... 365/207, 208

[56] References Cited

U.S. PATENT DOCUMENTS

| | | | |
|---|---|---|---|
| 5,303,196 | 4/1994 | Sang et al. | 365/207 |
| 5,694,364 | 12/1997 | Morishita et al. | 365/201 |
| 5,812,466 | 9/1998 | Lee et al. | 365/201 |

*Primary Examiner*—David Nelms
*Assistant Examiner*—M. Tran
*Attorney, Agent, or Firm*—Flehr Hobach Test Albritton & Herbert LLP

[57] ABSTRACT

A semiconductor memory includes cell array having a plurality of bit lines connected to respective input terminals of a column decoder. Input/output (I/O) lines are connected between respective output terminals of the column decoder and a plurality of sense circuits, where each sense circuit includes its own reference circuit, a sense amplifier, and equalizing circuit. The reference circuit includes a reference array essentially identical to the cell array and provides a reference voltage to respective first input terminals of its associated equalizing circuit and sense amplifier. Second input terminals of the equalizing circuit and sense amplifier of each sense circuit are connected to a corresponding I/O line. During read operations, the equalizing circuits are initially maintained in a conductive state so as to equalize the I/O line voltage and the reference voltages. Thereafter, the equalizing circuits transition to a non-conductive state so as to isolate the I/O line from the reference voltage. In response thereto, each I/O line voltage immediately changes to either a more positive or more negative voltage, depending on the binary state of the cell associated therewith.

23 Claims, 7 Drawing Sheets

SENSE AMPLIFIER WITH IMPROVED BIT LINE INITIALIZATION

BACKGROUND

1. Field of Invention

This invention relates generally to semiconductor memories and specifically to a sense amplifier for sensing a bit line voltage of a semiconductor memory.

2. Description of Related Art

Figure 1:
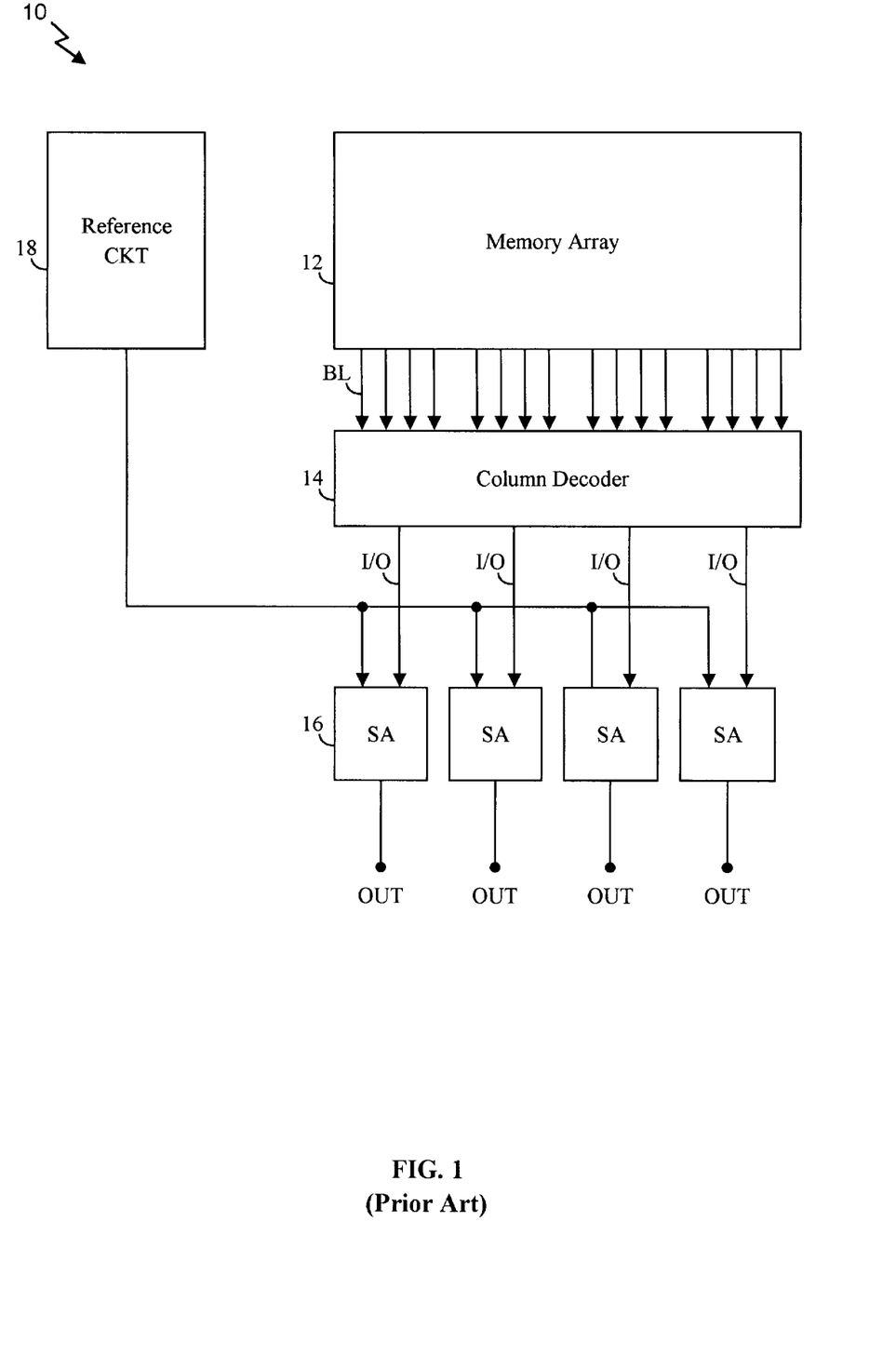
FIG. 1 is a block diagram of a prior art non-volatile semiconductor memory.

Sense amplifiers determine the binary state of a selected cell of a memory array by comparing the voltage on a selected bit line of the memory array to a reference voltage. For instance, FIG. 1 shows a EEPROM-type memory 10 including a cell array 12, a column decoder 14, sense amplifiers (SA) 16, and a reference circuit 18. The cell array 12 includes a plurality of NMOS non-volatile memory cells (not shown) arranged in sixteen columns, where the respective drains of the cells in a common column are connected to an associated bit line BL. Although not shown in FIG. 1 for simplicity, the memory 10 includes additional logic circuits such as, for instance, row decoders, input and output buffers, and so on.

As shown in FIG. 1, the sixteen bit lines BL of the array 12 are coupled to respective input terminals of the column decoder 14. The column decoder 14 includes four output terminals, each of which is associated with a specific group of four bit lines BL and connected to an associated sense amplifier 16 via an input/output (I/O) line. The reference circuit 18 includes a reference array (not shown for simplicity) having a configuration similar to that of the array 12, i.e., the reference array includes a plurality of NMOS memory cells similar to the NMOS memory cells of the array 12. Each sense amplifier 16 has an output terminal OUT, thereby providing the memory 10 with a four-bit output.

During read operations, four externally generated addresses are latched into the memory 10. These addresses are separated into row addresses and column address, where the row addresses are provided to four row decoders (not shown) and the column addresses are provided to the column decoder 14. In response to the row addresses, the row decoders select four respective rows of cells in the array 12. In response to the column address, the column decoder 14 selects four of the bit lines BL to couple to the four respective I/O lines. Signals indicative of the respective binary states of the four selected cells are provided to the four sense amplifiers 16. Each sense amplifier 16 compares the signal on its respective I/O line to a reference voltage $V_{REF}$ generated by the reference circuit 18 and, in response thereto, provides a signal indicative of the binary state of a corresponding cell of the array 12 onto its output terminal OUT. In this manner, four cells of the array 12 are read during each reading operation.

As mentioned above, the reference circuit 18 includes a reference array similar to, albeit smaller than, the array 12. In this manner, process variations arising during fabrication of the array 12 are matched in the reference array so that $V_{REF}$ tracks the bit line voltage. Typically, the reference voltage $V_{REF}$ is set at a predetermined value which approximates the bit line voltage. However, since this predetermined value is only an approximation, in actual applications the voltage differential between $V_{REF}$ and the bit line voltage may undesirably limit read speeds.

SUMMARY

A sensing circuit is disclosed herein which improves the speed and reliability of conventional semiconductor memories. A semiconductor memory is provided having a cell array with a plurality of bit lines connected to respective input terminals of a column decoder. Input/output (I/O) lines are connected between respective output terminals of the column decoder and a plurality of sense circuits, where each sense circuit includes its own reference circuit, a sense amplifier, and equalizing circuit. The reference circuit, which includes a reference array essentially identical to, albeit smaller than, the cell array, provides a reference voltage to respective first input terminals of its associated equalizing circuit and sense amplifier. Second input terminals of the equalizing circuit and sense amplifier of each sense circuit are connected to a corresponding I/O line.

During read operations, the equalizing circuit within each sense circuit is initially maintained in a conductive state so as to match its corresponding I/O line and reference voltages. Thereafter, the equalizing circuit within each sense circuit transitions to a non-conductive state, thereby releasing the I/O line voltage from the reference voltage. In response thereto, each I/O line voltage immediately changes to either a more positive or more negative voltage, depending on the binary state of the cell associated therewith. The sense amplifier within each sense circuit compares its I/O line voltage to its reference voltage and, in response thereto, provides at an output terminal thereof a signal indicative of the binary state of the associated cell.

Since the reference voltage and the I/O line voltage are equalized during an initial portion of each reading operation, a small subsequent voltage differential therebetween is sufficient to correctly ascertain the binary state of the selected cell. As a result, switching speeds and, thus, read speeds, are improved.

BRIEF DESCRIPTION OF THE DRAWINGS

Like components in the Figures are similarly labeled.

DETAILED DESCRIPTION

Principles of the present invention are described below with reference to a non-volatile semiconductor memory 20 for simplicity only. It is to be understood that embodiments of the present invention may be employed in memories of varying sizes (e.g., 64 k, 128 k, 256 k, 512 k, 1M, 2M, and so on), configurations (e.g., EPROM, EEPROM, Flash EEPROM), and bus widths (e.g., 8-bit, 16-bit, 32-bit, 64-bit, and so on). Further, principles of the present invention may be used in connection with any type of memory that employs sense amplifiers such as, for instance, SRAM, DRAM, NVDRAM, CAM, and so on. Accordingly, the present invention is not to be construed as limited to specific examples herein but rather includes within its scope all embodiments defined by the appended claims.

Figure 2:
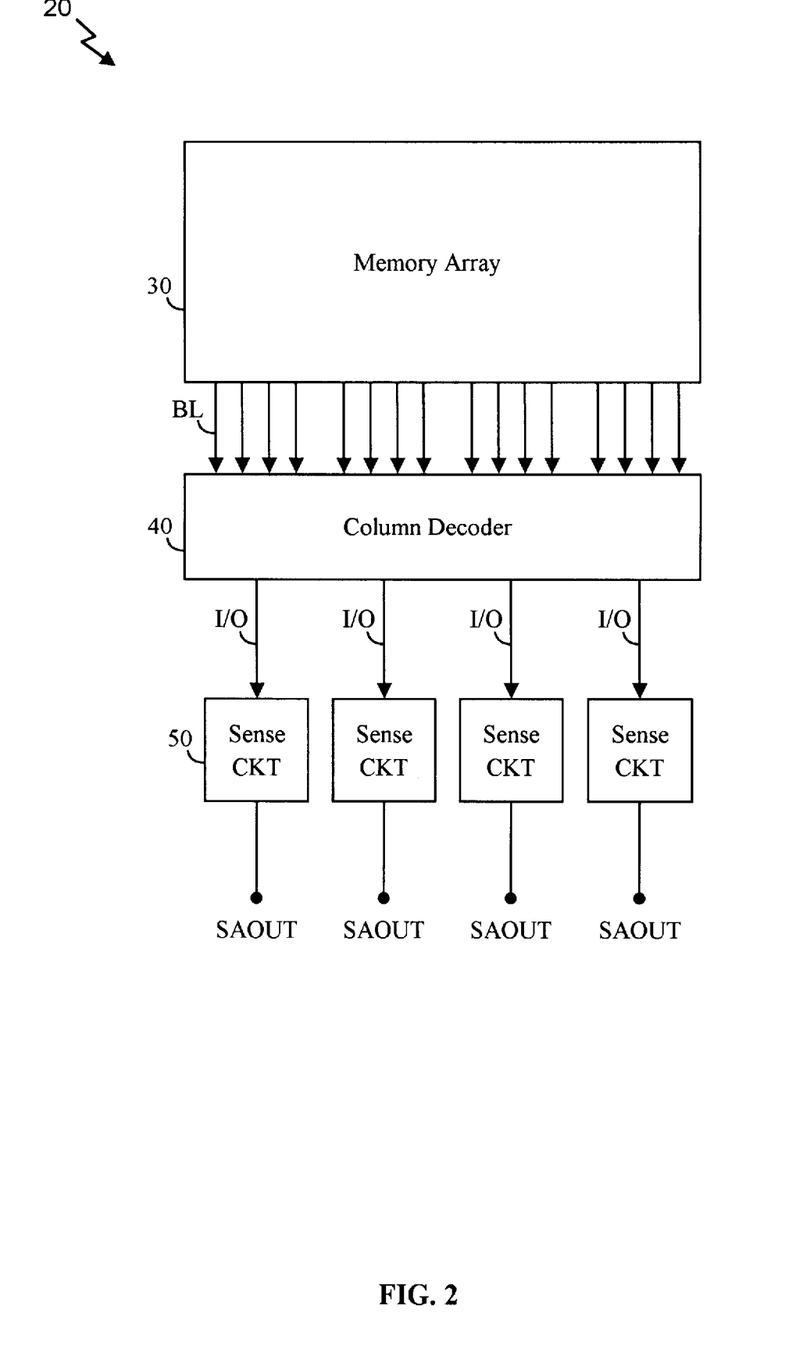
FIG. 2 is a block diagram of a non-volatile semiconductor memory in accordance with the present invention.

Referring to FIG. 2, the memory 20 is shown to include a memory cell array 30, a column decoder 40, and four sense circuits 50. Although not shown for simplicity, in actual embodiments the memory 20 includes additional logic circuits such as, for instance, row decoders, charge pumps, level shifters, input and output buffers, and so on. In preferred embodiments, the array 30 includes a plurality of PMOS memory cells. Examples of suitable PMOS memory cells and the advantages thereof are described in the commonly owned U.S. Pat. No. 5,666,307 and U.S. patent applications Ser. No. 08/557,589 entitled "A PMOS Memory Cell with Hot Electron Injection Programming and Tunneling Erasing" and filed on Nov. 14, 1995, Ser. No. 08/568,835 entitled "Triple Poly PMOS Flash Memory Cell" and filed on Dec. 7, 1995, and Ser. No. 08/568,544 entitled Double Poly Split Gate PMOS Flash Memory Cell" and filed Dec. 7, 1995, all incorporated herein by reference.

For convenience, it is assumed that the array 30 includes a plurality of PMOS memory cells of the type disclosed in the above-referenced U.S. patent application Ser. No. 08/557,589 and shown, for example, as cell 31 in FIG. 3. The PMOS floating gate transistor 31 is formed in an n− well region 32 of a p− substrate 33. A p+ source 34 and a p+ drain 35 are formed in the n− well region 32. A channel region 36 extends within the n− well 32 between the p+ source 34 and the p+ drain 35. A polysilicon floating gate 37 is insulated from the n− well region 32 by a thin oxide layer 38(a). A control gate 39 is insulated from the floating gate 37 by an insulating layer 38(b). In its intrinsic or erased state, the cell 31 has a negative threshold voltage $V_T$, and when in a programmed state, the cell 31 has a positive $V_T$.

Figure 3:
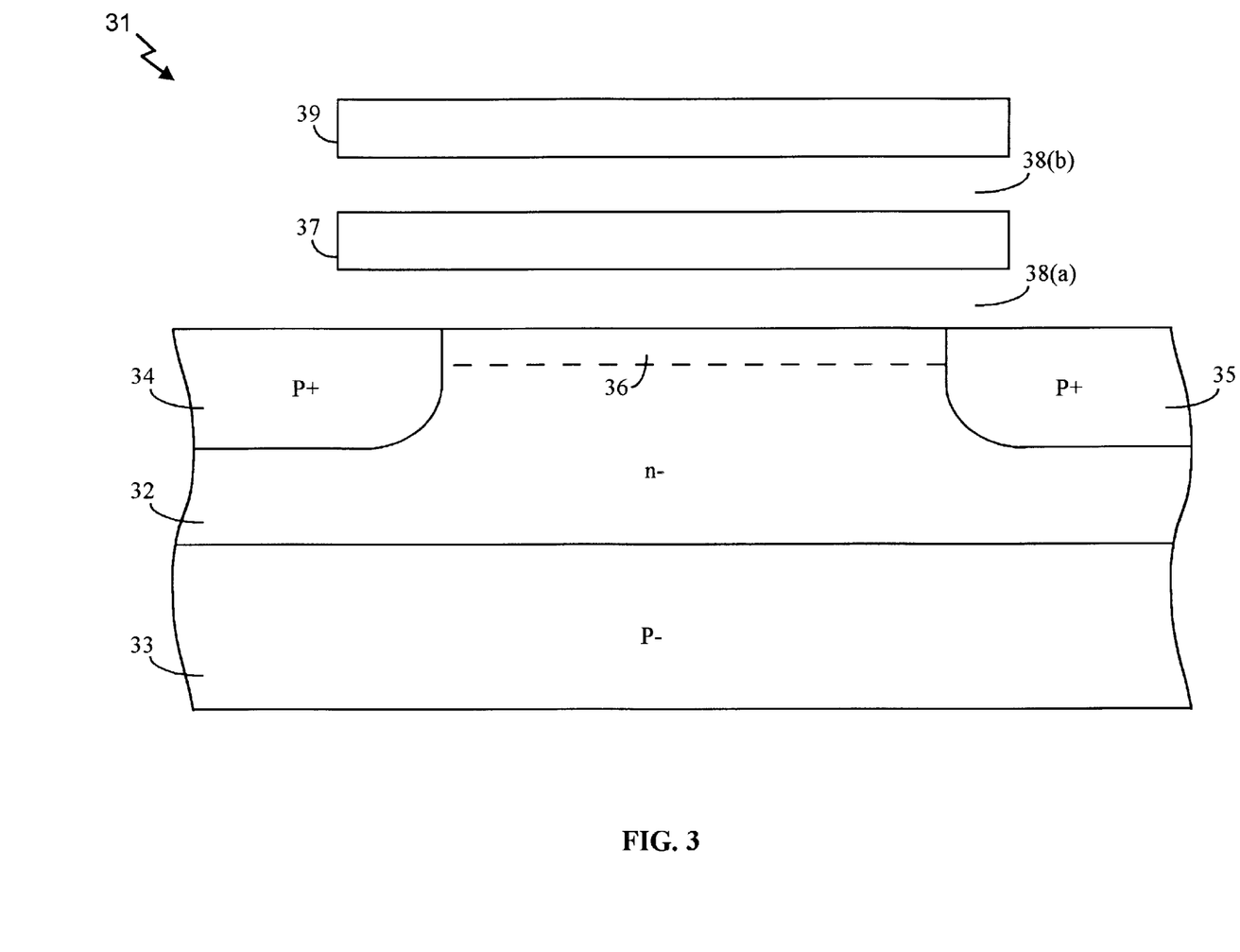
FIG. 3 is a cross-sectional diagram of a PMOS floating gate memory cell employed in one embodiment of the present invention.

The cell 31 may programmed by channel hot electron (CHE) injection, Fowler-Nordheim (FN) Tunneling, band-to-band tunneling (BTBT) induced hot electron injection, or by various combinations thereof. The cell 31 is erased by FN tunneling. The cell 31 is read by applying approximately 3 volts to the n− well region 32 and source 34, holding the drain 35 at a small positive voltage, and grounding the control gate 39. Under these bias conditions, the cell 31 conducts a channel current if in the programmed state.

The array 30 may employ the floating gate transistors 31 in a variety of suitable cell configurations, such as those described in the commonly owned U.S. patent applications Ser. No. 08/911,968 entitled "Non-volatile Memory Array Architecture" and filed Aug. 15, 1997, Ser. No. 08/948,531 entitled "PMOS MEMORY ARRAY HAVING OR GATE ARCHITECTURE" and filed Oct. 9, 1997, and Ser. No. 08/947,850 entitled "NONVOLATILE PMOS TWO TRANSISTOR MEMORY CELL AND ARRAY" and filed Oct. 9, 1997, all incorporated herein by reference. However, for simplicity of discussion herein, it is assumed that the array 30 employs the floating gate transistors 31 as one-transistor (1T) memory cells, i.e., without select transistors, as described in the above-referenced U.S. patent application Ser. No. 08/911,968.

Thus, the 1T cells 31 (not shown in FIG. 2) of the array 30 are arranged in sixteen columns, where the cells 31 in a common column are coupled to an associated bit line BL. The sixteen bit lines BL of the array 30 are connected to respective input terminals of the column decoder 40. The column decoder 40 is shown to include four output terminals, where each output terminal is associated with a corresponding four of the bit lines BL and is connected to an associated one of the sense circuits 50 via the I/O lines. Each sense circuit 50 includes an output terminal SAOUT, thereby giving the memory 20 four output terminals SAOUT.

Figure 4:
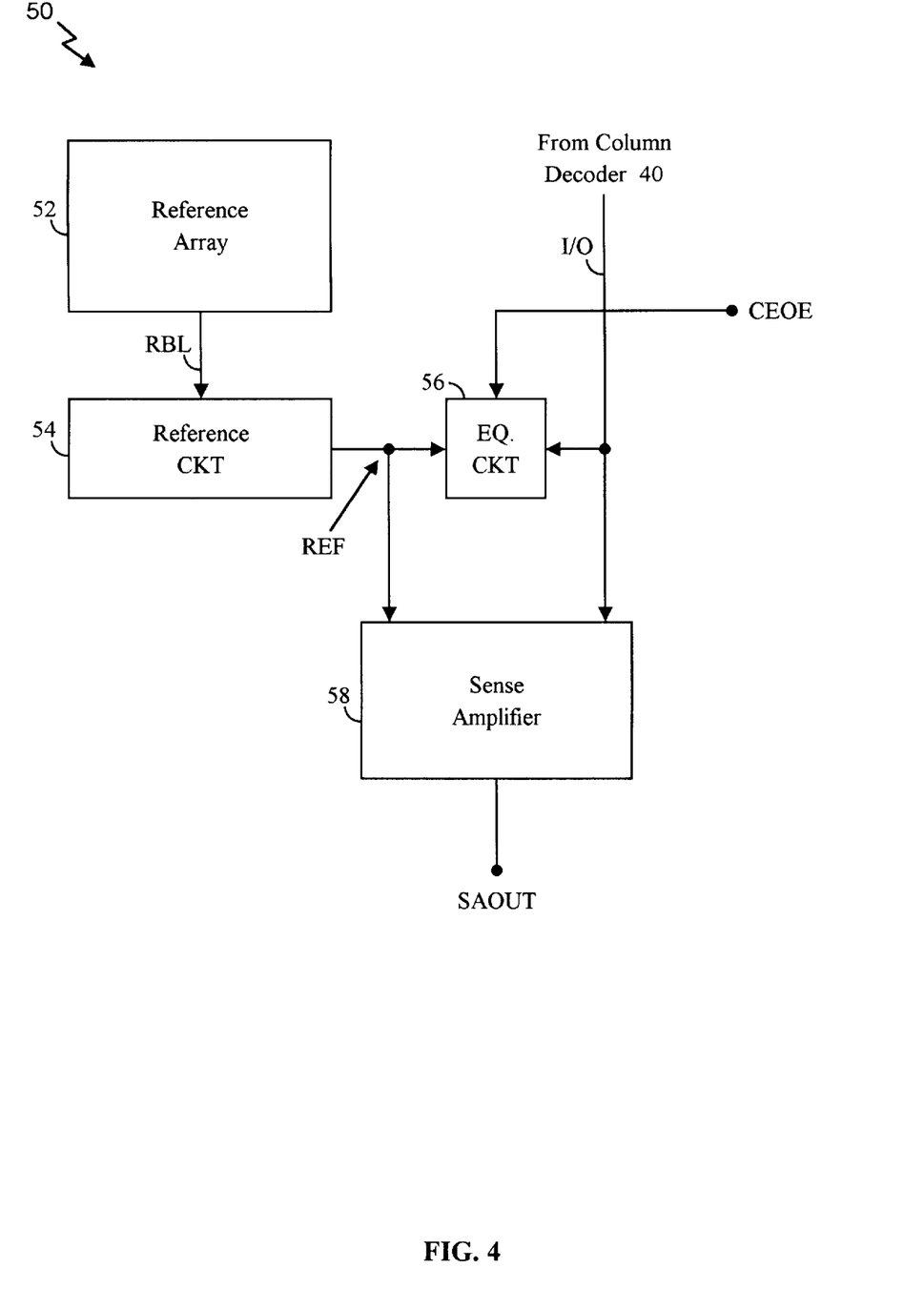
FIG. 4 is a block diagram of a sensing circuit in accordance with the present invention.

Referring now to FIG. 4, each sense circuit 50 includes a reference array 52, a reference circuit 54, an equalizing circuit 56, and a sense amplifier 58. The reference array 52 is essentially identical to, albeit smaller than, the array 30. Accordingly, the reference array 52 includes a plurality of 1T PMOS memory cells of the type shown in FIG. 3. A reference bit line RBL is connected between the reference array 52 and an input terminal of the reference circuit 54. A reference line REF is connected between an output terminal of the reference circuit 54 and respective first input terminals of the equalizing circuit 56 and sense amplifier 58. An associated I/O line from the column decoder 40 is connected to respective second input terminals of the equalizing circuit 56 and sense amplifier 58. The equalizing circuit 56 has a control terminal coupled to receive an enable signal CEOE.

The cells (not shown in FIG. 4) of the reference array 52 are maintained in a programmed state so as to provide a substantially constant current on the reference bit line RBL when the reference array 52 is enabled. This substantially constant current induces a reference voltage $V_{REF}$ on the reference line REF which is provided to the respective first input terminals of the equalizing circuit 56 and sense amplifier 58.

During reading operations, all bit lines BL of the array 30 are at a floating potential. The enable signal CEOE is initially in a first logic state which, in turn, forces the equalizing circuit 56 into a conductive state. The reference line REF and the I/O line are thereby shorted together and, as a result, the voltage on the I/O line is equal to the reference voltage $V_{REF}$. In this manner, the reference voltage $V_{REF}$ of each sense circuit 50 precisely tracks its corresponding I/O line voltage. Externally generated row and column addresses are latched into the memory 20 in a well known manner, thereby selecting four cells 31 for reading. In response thereto, the four bit lines BL associated with these four selected cells 31 transition to one of two voltage levels, depending upon the binary states of the four respective cells 31. For instance, if in the programmed state, a selected cell 31 conducts a channel current and thereby charges its associated bit line BL to a potential greater than $V_{REF}$ and, conversely, if in the erased state, the selected cell 31 does not conduct a channel current and thereby forces its associated bit line BL to a potential less than $V_{REF}$.

Thereafter, the column decoder 40 is enabled and thereby connects the bit lines BL associated with the four selected cells 31 to the respective I/O lines. The enable signal CEOE then transitions to a logic high state. In response thereto, the equalizing circuit 56 within each sense circuit 50 becomes non-conductive and thereby isolates its reference line REF from its corresponding I/O line. Once released from $V_{REF}$, the I/O line voltage immediately follows the voltage on its corresponding bit line BL. For instance, if a selected cell 31 is in the programmed state, the I/O line voltage increases above the reference voltage $V_{REF}$ and, conversely, if the selected cell 31 is in the erased state, the I/O line voltage decreases below the reference voltage $V_{REF}$. The sense amplifier 58 within each sense circuit 50 compares the voltage differential between its reference line and its corresponding I/O line and, in response thereto, generates at its output terminal SAOUT a signal indicative of the binary state of the corresponding one selected cell 31.

Present embodiments are advantageous in several respects over conventional sense amplifiers. First, during an initial portion of a reading operation, the reference voltage $V_{REF}$ is equalized with I/O line voltage. As a result the reference voltage $V_{REF}$ automatically tracks the I/O line voltage. This is in marked contrast to the operation of conventional sense amplifiers in which the reference voltage is maintained at some predetermined voltage which approximates the I/O line voltage. Thus, when an I/O line of present embodiments is isolated from the reference line, the I/O line voltage either rises above or falls below reference voltage $V_{REF}$ depending, as described above, on the binary state of the corresponding selected cell 31. Therefore, since the I/O line voltage is initially matched to $V_{REF}$, only a minimal voltage change in the I/O line, when released from the reference line, is necessary to ascertain the binary state of the selected cell 31. Accordingly, the I/O line may more readily switch between logic state, as compared to that of conventional memories and, as result, present embodiments allow for superior read speeds, as compared to conventional memories.

Further, in accordance with the present invention, each sense circuit 50 includes its own reference array 52 and, thus, its own reference voltage $V_{REF}$. As a result, the capacitance on both the reference line REF and the corresponding input terminal of its sense amplifier 58 is minimized, thereby allowing for further improvements in read speeds. This is in marked contrast to conventional memories such as, for instance, that shown in FIG. 1, in which a single reference voltage is provided to each and every sense amplifier in the memory.

The following describes a preferred implementation of the present invention where the array 30 includes a plurality of the PMOS 1T memory cells 31 which, when in the programmed state, conduct a channel current of approximately 30 $\mu$A. Here, the column decoder 40 includes first and second rows of MOS transistors which, in response to the externally generated column addresses, selectively connect four of the bit lines BL to the four I/O lines.

Figure 5:
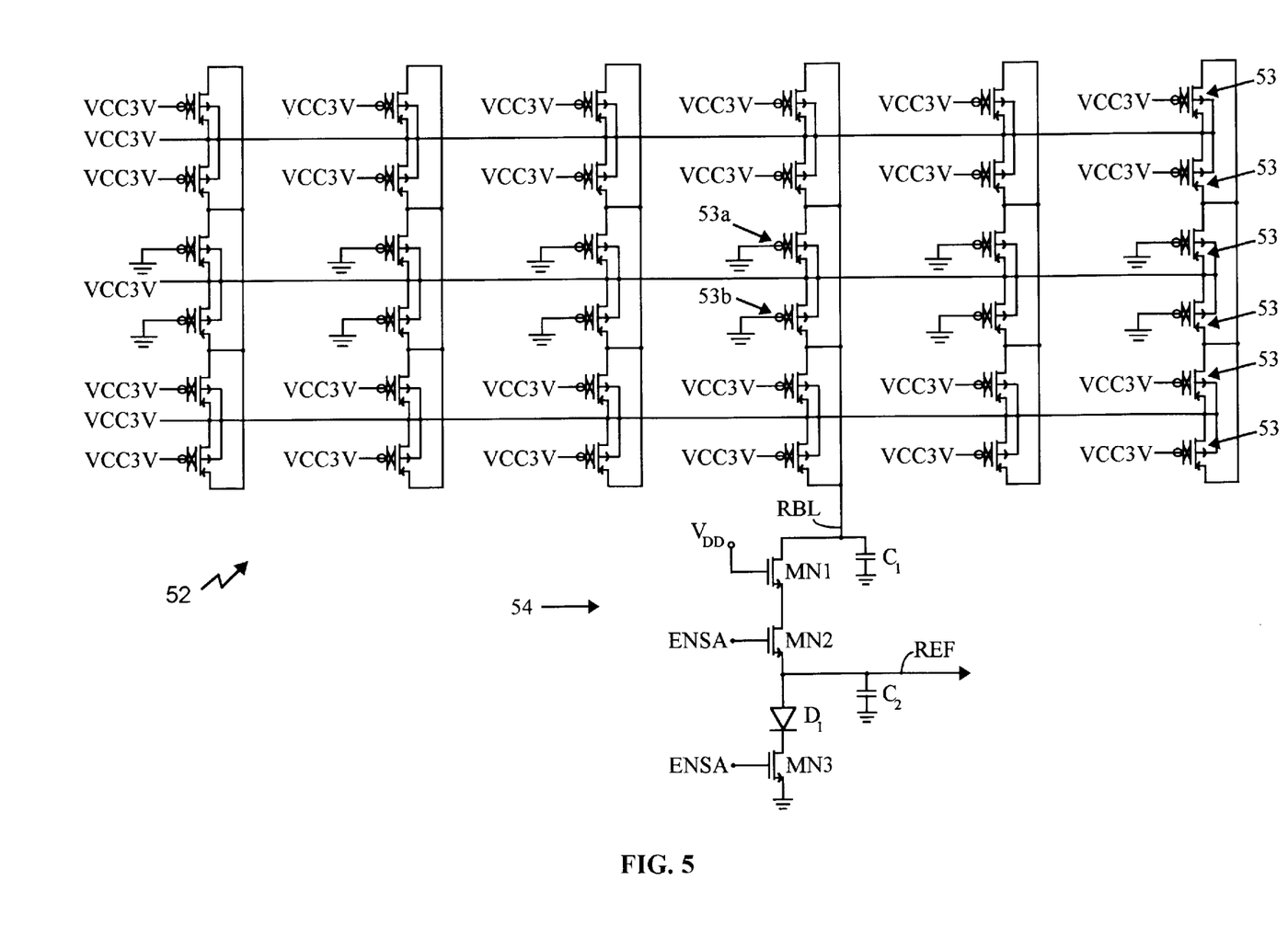
FIG. 5 is a schematic diagram of a reference array and reference circuit in a preferred embodiment of the sensing circuit of FIG. 4.

The reference array 52 and reference circuit 54 not only generate the reference voltage $V_{REF}$ but also model the array 30 and column decoder 40, respectively. Thus, referring to FIG. 5, the reference array 52 includes a plurality of PMOS 1T cells 53 which are essentially identical to the cells 31 of the array 30, except that the cells 53 of the reference array 52 are scaled so as to conduct approximately one-half the channel current as do the cells 31 in the array 30. Each cell 53 of the reference array 52 is in a programmed state and, therefore, conducts a channel current of approximately 15 $\mu$A under proper bias conditions. Specifically, the cells 53 of the reference array 52 are formed in a common n− well region and are arranged in a 6×6 matrix, as shown in FIG. 5. The p+ sources of the cells 53 are coupled to the n− well region which, in turn, is maintained at a supply voltage $V_{cc}$ of approximately 3 volts. The control gates of the reference cells 53 in the first, second, fifth, and sixth columns of the reference array 52 are held at $V_{cc}$ to maintain them in a non-conductive state. The control gates of the reference cells 53 in the third and fourth rows of the reference array 52 are coupled to ground potential. The drains of the reference cells 53 in the fourth column of the reference array 52 are coupled to the reference bit line RBL, while the drains of the reference cells 53 in the remaining columns of the reference array 52 are at a floating potential. Accordingly, under these bias conditions, only the cells 53 in the third and fourth rows of the reference array 52 which are coupled to the reference bit line RBL, i.e., the cells 53a and 53b, conduct a channel current. These two cells 53a and 53b are known as reference cells, while the remaining cells 53 are known as dummy cells.

The configuration of the reference array 52 shown in FIG. 5 improves stability and minimizes undesirable effects of fabrication process errors. First, note that the dummy cells 53 form the periphery of the reference array 52 and thereby encapsulate the reference cells 53a and 53b. Thus, fabrication errors inherent to peripheral portions of a semiconductor die affect only the dummy cells 53. Further, the reference array 52 includes two reference cells 53a and 53b which together conduct approximately 30 $\mu$A of current, as opposed to a including single reference cell which conducts approximately 30 $\mu$A of current. These two reference cells 53a and 53b are in adjacent rows of the reference array 52. Since alignment errors are typically complementary in adjacent rows, any such alignment errors in one of the reference cells of the reference array 52 are compensated for in the other reference cell.

In other embodiments, the reference array 52 maybe replaced by a conventional current source which sources approximately 30 $\mu$A of current to the reference bit line RBL. For instance, an MOS transistor having a gate coupled to receive a bias voltage may be employed, thereby allowing the current therethrough to be adjusted, in response to the bias voltage, so as to precisely match the channel current of a cell 31 of the array 30.

The reference circuit 54 includes first and second pass transistors MN1 and MN2 which are connected in series between the reference bit line RBL and the reference line REF and thereby model the column decoder 40 associated with the array 30. A diode $D_1$ and a third pass transistor MN3 are connected in series between the reference line REF and ground potential. In preferred embodiments, the diode $D_1$ is an NMOS diode-connected transistor. The gate of the first pass transistor MN1 is coupled to a supply voltage $V_{DD}$ so as to maintain transistor MN1 in a conductive state. The gates of the second and third pass transistors MN2 and MN3 are coupled to receive a sense amplifier enable signal ENSA. A first capacitor $C_1$ coupled between the reference line REF and ground potential models the bit line capacitance of the array 30 and, thus, should be of a value equal to the capacitance of the bit lines BL of the array 30. A second capacitor $C_2$ coupled between the reference line REF and ground potential models the capacitance of the column decoder 40 and, thus, should be of a value equal to the capacitance of the column decoder 40. In one embodiment, the capacitors $C_1$ and $C_2$ are approximately 0.5 pF and 1.0 pF, respectively. In preferred embodiments, the capacitors $C_1$ and $C_2$ are MOS transistor devices.

Figure 6:
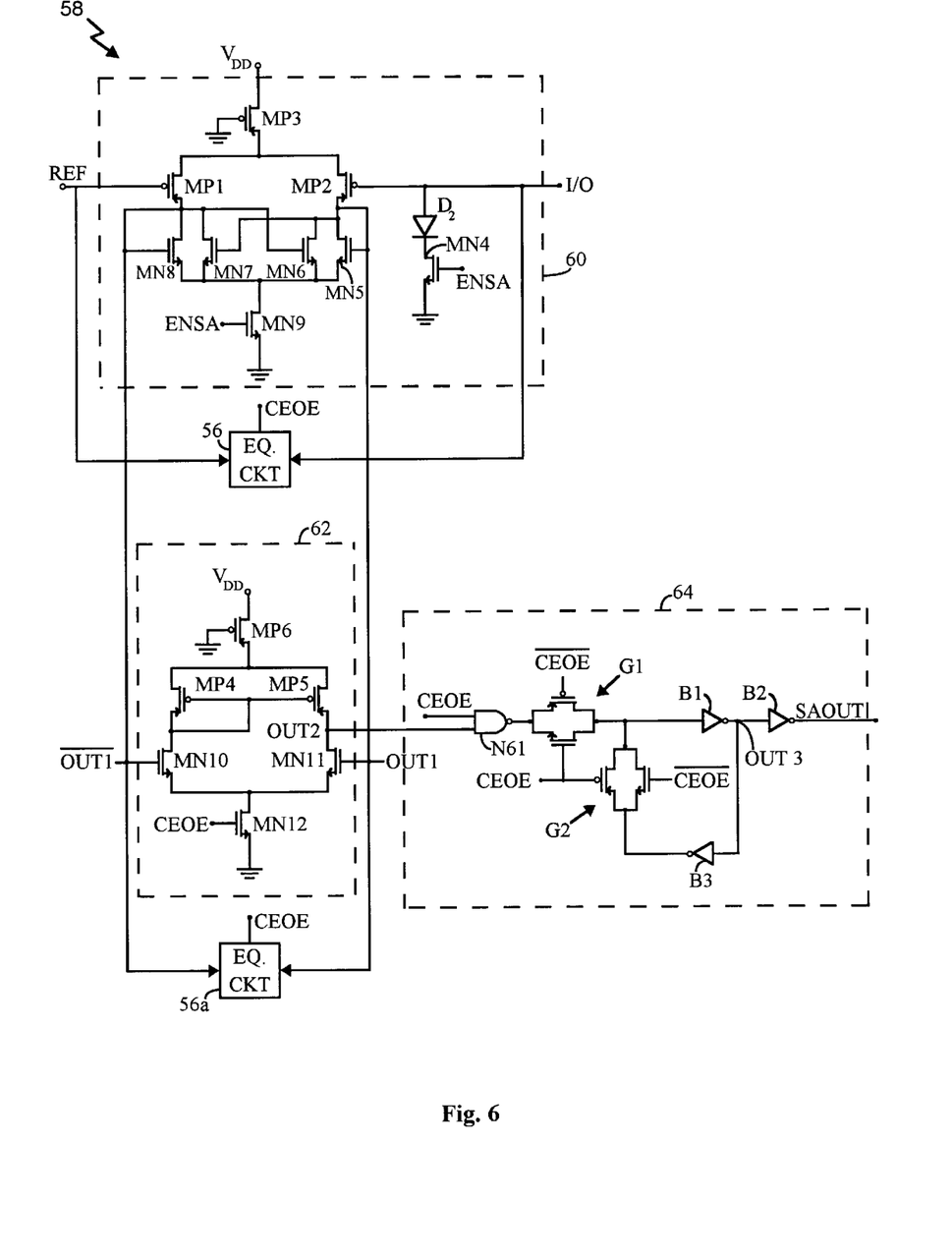
FIG. 6 is a schematic diagram of a sense amplifier in the preferred embodiment of the sensing circuit of FIG. 4.

Referring to FIG. 6, the sense amplifier 58 in this preferred implementation is shown to include a level shift stage 60, a differential stage 62, and a latch stage 64. The level shift stage 60 includes first and second PMOS input transistors MP1 and MP2 coupled to the reference line REF and the I/O line, respectively. The reference line REF and the I/O line are also connected to respective first and second input terminals of the equalizing circuit 56, the conductive state of which is controlled by the signal CEOE. A PMOS transistor MP3 biases the input transistors MP1 and MP2 with a current of approximately 0.5 mA. A diode $D_2$ and an NMOS pass transistor MN4 are connected in series between the I/O line and ground potential. In preferred embodiments, the diode $D_2$ is an NMOS diode-connected transistor. A cross-coupled latch formed by NMOS transistors MN5–MN8 is biased by an NMOS transistor MN9. The gates of the pass transistor MN4 and the bias transistor MN9 are coupled to receive the signal ENSA. As will explained below, the level shift stage 60 receives a voltage differential between the reference line REF and the I/O line and, in response thereto, provides corresponding level-shifted voltage differential across its output terminals $\overline{OUT1}$ and OUT1.

The differential stage 62 includes a differential transistor pair MN10 and MN11 having gates coupled to the output terminals OUT1 and $\overline{OUT1}$, respectively, of the level shift stage 60. The differential transistor pair MN10 and MN11 is biased by an NMOS transistor MN12 having a gate coupled to receive the signal CEOE. A current mirror formed by two PMOS transistors MP4 and MP5 provides equal currents to the differential pair transistors MN10 and MN11. The current mirror is biased by a PMOS transistor MP6 having a gate coupled to ground potential. The differential stage 62 provides a single-ended output at node OUT2.

The latch 64 includes a NAND gate G1 having first and second input terminals coupled to receive the output signal at node OUT2 and the signal CEOE, respectively. The output terminal of the NAND gate NG1 is connected to an input terminal of a CMOS gate G1. A first inverting buffer B1 is connected between the output terminal of the gate G1 and an output node OUT3. A second inverting buffer B2 is connected between the output node OUT3 and the output terminal of the sense circuit 50. A third inverting buffer B3 and a second CMOS gate G2 form a feedback path between the output node OUT3 and the output terminal of the first CMOS gate G1.

Specifically, the first CMOS gate G1 includes an NMOS transistor and a PMOS transistor having gates coupled to receive signal CEOE and its complement signal $\overline{CEOE}$, respectively, and the second CMOS gate G2 includes an NMOS transistor and a PMOS transistor having gates coupled to receive the signals $\overline{CEOE}$ and CEOE, respectively. The buffers B1–B3 are conventional inverting buffers allowing for a rail-to-rail voltage swing.

The reading operation of the memory 30 is described below with reference to the timing diagram of FIG. 7. Referring also to FIGS. 4–6, the enable signal ENSA is initially in a logic low state, thereby maintaining the second and third pass transistors MN2 and MN3 of the reference circuit 54 in a non-conductive state. Transistor MN2 isolates the reference line REF from the reference bit line RBL and transistor MN3 isolates the reference line REF from ground potential, thereby allowing the reference line REF float. The logic low level of the signal ENSA also maintains transistors MN4 and MN9 of the level shift stage 60 of the sense amplifier 58 in a non-conductive state, where transistor MN4 isolates the I/O line from ground potential and transistor MN9 prevents current flow in, and thereby disables, the level shift stage 60.

The signal CEOE is generated by combining a chip enable signal $\overline{CE}$ and an output enable signal $\overline{OE}$ in a NAND gate (not shown). As known in the art, the chip enable signal $\overline{CE}$, when active, enables the chip upon which the memory 30 is fabricated, and the output enable signal $\overline{OE}$, when active, enables output buffers and address decoding logic, e.g., the column decoder 40.

Figure 7:
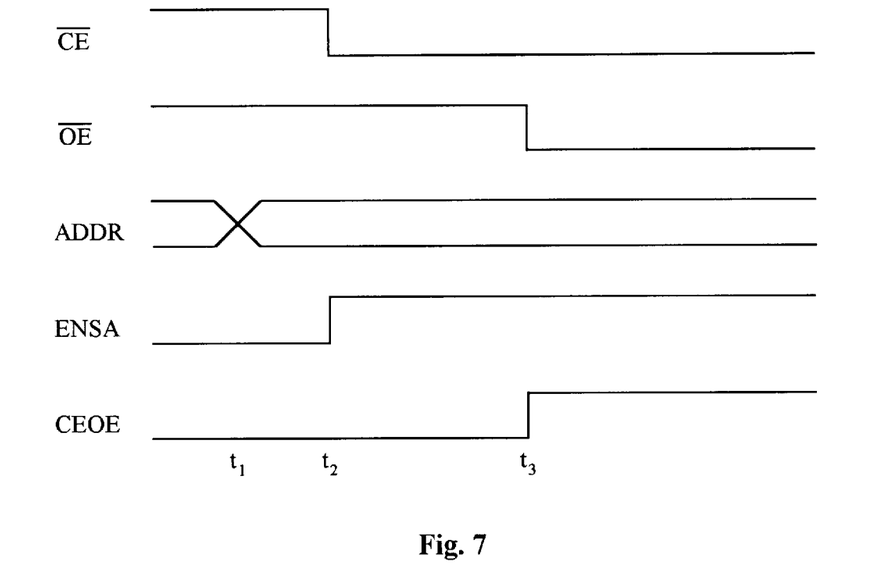
FIG. 7 is a timing diagram of various enable signals used during a reading operation of the memory in accordance with the present invention.

During reading operations, the respective addresses of four selected cells of the array 30 are provided on the input address pins (not shown for simplicity) of the memory 20, as indicated by time $t_1$ in FIG. 7. Soon thereafter, at time $t_2$, the chip enable signal CE transitions to a logic low level, thereby latching the addresses into the row decoder (not shown for simplicity) and the column decoder 40, and the signal ENSA transitions to a logic high level, thereby turning on the second and third pass transistors MN2 and MN3. The voltage on the reference line REF immediately rises to approximately one diode drop above ground potential, e.g., 0.7 volts, due to the diode $D_1$. Note that if it is desired to initially maintain the reference line REF at a lower voltage, additional diodes may be provided in parallel to the diode $D_1$. The reference cells 53a and 53b are in the programmed state and, as mentioned above, together source a current of approximately 30 $\mu$A to the reference bit line RBL which, in turn, pulls the reference line REF to approximately 1.0 volts.

The logic high state of the signal ENSA also turns on transistors MN4 and MN9, thereby enabling the level shift stage 60. Since the signal CEOE is in a logic low state, the equalizing circuit 56 is in the conductive state and thereby shorts the reference line REF to the I/O line. Accordingly, the voltage on the I/O line is equal to the reference voltage $V_{REF}$, i.e., approximately 1.0 volts.

At time $t_3$, the output enable signal $\overline{OE}$ transitions from a logic high level to a logic low level, thereby enabling the output buffers of the memory 20. Since both signals $\overline{CE}$ and $\overline{OE}$ are low, the NAND signal CEOE transitions to a logic high level at time T3. In response thereto, the equalizing circuit 56 becomes non-conductive and thereby isolates the I/O line from the reference line REF. While the voltage on the reference line REF remains substantially constant, the voltage on the I/O line either increases or decreases, depending upon the binary state of the selected cell 31 in the array 30.

If in the programmed state, the selected cell 31 conducts a channel current of approximately 30 $\mu$A and, as mentioned earlier, thereby charges its bit line BL to approximately 1.2 volts. In response to the input address, the column decoder 40 connects the selected bit line BL to the corresponding I/O line and, as a result, approximately 1.2 volts appears on the gate of transistor MP2. With approximately 1.0 volts on the gate of transistor MP1, nodes OUT1 and $\overline{OUT1}$ of the level shift stage 60 are at approximately 2.0 volts and 2.2 volts, respectively.

If, on the other hand, the selected cell 31 is in the erased state, the selected cell 31 does not conduct a channel current. In response thereto, the voltage on the I/O line is approximately one diode drop above ground potential, i.e., 0.8 volts, due to the diode $D_2$. In response to this voltage differential between the reference line REF and the I/O line, the nodes OUT1 and $\overline{OUT1}$ of the level shift stage 60 are at approximately 2.2 volts and 2.0 volts, respectively. In this manner, the level shift stage 60 levels shifts the differential voltage between the reference line REF and the I/O line.

The resulting voltage differential between the nodes $\overline{OUT1}$ and OUT1 appears across the differential transistor pair MN10 and MN11. Where the nodes OUT1 and $\overline{OUT1}$ are at approximately 2.0 volts and 2.2 volts, respectively, i.e., where the selected cell 31 is in the programmed state, a voltage of approximately 4.0 volts appears at the node OUT2 of the differential phase 62. On the other hand, where the nodes OUT1 and $\overline{OUT1}$ are at approximately 2.2 volts and 2.0 volts, respectively, i.e., where the selected cell 31 is in the erased state, a voltage of approximately 1.0 volts appears at the node OUT2.

The signal level at the node OUT2 is combined with the logic high signal CEOE in the NAND gate NG1. The threshold voltage of the NAND gate NG1 is set at approximately 2.5 volts. Accordingly, if the voltage at node OUT2 is approximately 4.0 volts, the NAND gate NG1 outputs a logic low signal to the CMOS gate G1. This logic low signal passes through the CMOS gate G1 and buffers B1 and B2, whereby a logic low signal appears at the output terminal SAOUT of the sense circuit 50, thereby indicating that the selected cell 31 is in the programmed state. Conversely, if the voltage at node OUT2 is approximately 1.0 volts, the NAND gate NG1 outputs a logic high signal to the CMOS gate G1. This logic high signal passes through the CMOS gate G1 and the buffers B1 and B2, whereby a logic high signal appears at the output terminal SAOUT, thereby indicating that the selected cell 31 is in the erased state.

The buffers B1 and B2 ensure that the signal provided at the output terminal SAOUT has rail-to-rail swing between ground potential and the supply voltage $V_{DD}$. Once the binary state of the selected cell 31 is provided at the output terminal SAOUT, the output enable signal $\overline{OE}$ transitions to logic high level which, in turn, forces the signal CEOE to a logic low level. In response thereto, the CMOS gate G1 becomes nonconductive, thereby isolating the latch stage 64 from the differential stage 62, and the CMOS gate G2 becomes conductive, thereby latching the binary state of the selected cell 31 in the latch formed by inverting buffers B1 and B3. In this manner, the binary state of the selected cell 31 is stored in the latch stage 64, thereby allowing this information to be subsequently provided without having to access the array 30.

In some embodiments, the signals CEOE and ENSA are returned to their respective logic low states after a predetermined period of time, irrespective of the logic states of signals $\overline{CE}$ and $\overline{OE}$. In this manner, the equalizing circuits are returned a conductive state and the latch 64 is enabled so as to stored binary information. Further, the level shift stage 60 and the differential stage 62 are disabled, thereby minimizing currennt flow therethrough which, in turn, reduces power dissipation.

Further, the transitioning of the signal CEOE to a logic low level forces the equalizer circuit 56 to a conductive state, thereby once again equalizing the voltages on the reference line REF and the I/O line in anticipation of a subsequent read operation. In some embodiments, the I/O line voltage needs only move approximately 100 mV in order for the binary state of the selected cell 31 to be ascertained.

Figure 8:
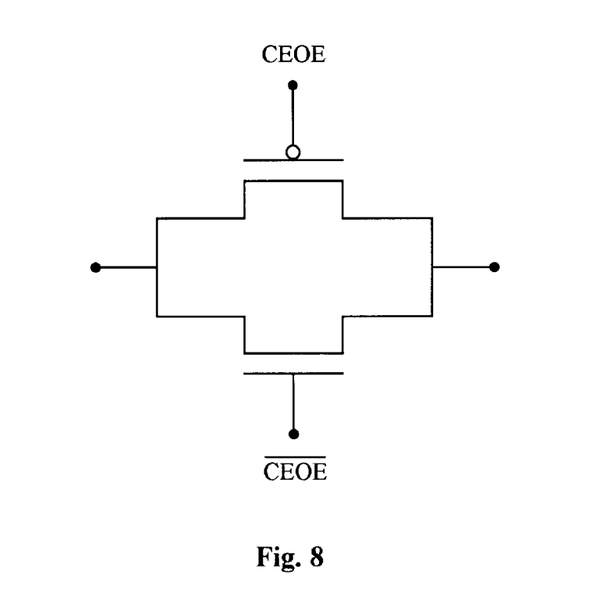
FIG. 8 is a schematic diagram of the equalizing circuit in the preferred embodiment of the sensing circuit of FIG. 4.

In preferred embodiments, the equalizing circuit 56 is formed of a PMOS transistor having first and second terminal coupled to the reference line REF and the I/O line, respectively, and an NMOS transistor having first and second terminal coupled to the reference line REF and the I/O line, respectively. The gate of the PMOS transistor is coupled to receive the signal CEOE, while the gate of the NMOS transistor is coupled to receive the complement signal $\overline{CEOE}$. Further, in preferred embodiments, a first additional equalizing circuit 56 is coupled between the output terminals OUT1 and $\overline{OUT1}$, thereby ensuring the voltages at such terminals are equal prior to reading.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A sensing circuit comprising:
   a first input terminal coupled to receive from an I/O line a first voltage indicative of the binary state of a memory cell of an associated array;
   a second terminal coupled to receive a reference voltage;
   an equalizing circuit having a first terminal coupled to receive said first voltage, a second terminal coupled to receive said reference voltage, and a control terminal coupled to receive an enable signal;
   a sense amplifier having a first input terminal coupled to receive said first voltage and a second input terminal coupled to receive said reference voltage, said sense amplifier comparing said first voltage to said reference voltage during a read operation and, in response thereto, providing an output signal indicative of the binary state of said memory cell, wherein immediately prior to said read operation, said equalizing circuit is in a conductive state and thereby equalizes said first voltage and said reference voltage, and during said read operation said equalizing circuit is in a non-conductive state and thereby isolates said first voltage from said reference voltage; and
   said equalizing circuit comprises a CMOS gate.

2. The sensing circuit of claim 1, wherein said CMOS gate comprises:
   a PMOS transistor having a first terminal coupled to receive said first voltage, a second terminal coupled to receive said reference voltage, and a control terminal coupled to receive said enable signal; and
   an NMOS transistor having a first terminal coupled to receive said first voltage, a second terminal coupled to receive said reference voltage, and a control terminal coupled to receive a complement of said enable signal.

3. The sensing circuit of claim 1, wherein said reference circuit further comprises a reference array having a reference circuit for providing said reference voltage, said reference array having a plurality of said memory cells.

4. The sensing circuit of claim 3, wherein each of said memory cells comprises a PMOS floating gate transistor.

5. The sensing circuit of claim 1, further comprising a level shift circuit coupled between said input terminals of said sensing circuit and said input terminals of said sense amplifier, said level shift circuit shifting the voltage levels of said first voltage and said reference voltage to generate a shifted first voltage and a shifted reference voltage, respectively.

6. The sensing circuit of claim 5, further comprising a second equalizing circuit having a first terminal coupled to receive said shifted first voltage, a second input terminal coupled to receive said shifted reference voltage, and a control terminal coupled to receive said enable signal, wherein immediately prior to said read operation said second equalizing circuit is in a conductive state and thereby equalizes said shifted first voltage to said shifted reference voltage, and during said read operation said second equalizing circuit is in a non-conductive state and thereby isolates said shifted first voltage from said shifted reference voltage.

7. The sensing circuit of claim 6, wherein said second equalizing circuit comprises a CMOS gate.

8. The sensing circuit of claim 1, wherein said sense amplifier comprises a differential amplifier including a first transistor having a gate coupled to receive said first voltage and including a second transistor having a gate coupled to receive said reference voltage.

9. The sensing circuit of claim 8, wherein said output signal is taken at a drain of said first transistor.

10. The sensing circuit of claim 9, further comprising a third equalizing circuit having a first input terminal coupled to said drain of said first transistor, a second terminal coupled to a drain of said second transistor, and a control terminal coupled to receive said enable signal, wherein during said first portion of said read operation said third equalizing circuit is in a conductive state and thereby equalizes the drain voltage of said second transistor to the drain voltage of said first transistor, and during said second portion of said read operation said third equalizing circuit is in a non-conductive state and thereby isolates the drain of said second transistor from the drain of said first transistor.

11. The sensing circuit of claim 10, wherein said third equalizing circuit comprises a CMOS gate.

12. The sensing circuit of claim 9, further comprising a latch having an input terminal coupled to receive said output signal and having an output terminal.

13. The sensing circuit of claim 12, wherein said latch further comprises:
- a first pass gate having an input terminal coupled to receive said output signal, an output terminal, and a control terminal coupled to receive said enable signal;
- a first buffer having an input terminal coupled to said output terminal of said first pass gate and having an output terminal;
- a second buffer having an input terminal coupled to said output terminal of said first buffer and having an output terminal;
- a second pass gate having an input terminal coupled to said output terminal of said second buffer, an output terminal coupled to said output terminal of said first pass gate, and a control terminal coupled to receive a complement of said enable signal.

14. The sensing circuit of claim 1, further comprising:
said output signal being a first level shifted output and a second level shifted output;
- a difference amplifier having a first difference input, a second difference input and a difference output;
said first difference input being coupled to said first level shifted output;
said second difference input being coupled to said second level shifted output;
said first difference input and said second difference input providing a difference output thereby; and
- a difference equalizing circuit having a first terminal coupled to receive said first difference input, a second terminal coupled to receive said second difference input and a control terminal coupled to receive an enable signal;
wherein said difference equalizing circuit comprises a CMOS gate.

15. The sensing circuit of claim 14, wherein said CMOS gate comprises:
- a PMOS transistor having a first terminal coupled to receive said first voltage, a second terminal coupled to receive said reference voltage and a control terminal coupled to receive said enable signal; and
- an NMOS transistor having a first terminal coupled to receive said first voltage, a second terminal coupled to receive said reference voltage and a control terminal coupled to receive a complement of said enable signal.

16. The sensing circuit of claim 14, further comprising a latch having a latch input coupled to receive said difference output and a latch output.

17. The sensing circuit of claim 16, wherein said latch further comprises:
- a NAND gate having a first nand input, a second nand input and a nand output;
said first nand input being coupled to said latch input;
said second nand input being coupled to said enable signal;
- a first pass gate having an input terminal coupled to receive said nand output, an output terminal and a control terminal coupled to receive said enable signal;
- a first buffer having an input terminal coupled to said output terminal of said first pass gate and an output terminal;
- a second buffer having an input terminal coupled to said output terminal of said first buffer and an output terminal;
- a third buffer having an input coupled to said output terminal of said first buffer and an output coupled to said latch output;
- a second pass gate having an input terminal coupled to said output terminal of said second buffer, an output terminal coupled to said output terminal of said first pass gate and a control terminal coupled to receive a complement of said enable signal.

18. A memory comprising:
- an array including a plurality of columns of cells, wherein each of said columns is coupled to an associated one of a plurality of bit lines;
- a column decoder having a plurality of input terminals connected to respective ones of said bit lines and having a number of output terminals each of which is coupled to an I/O line; and
- a number of sense circuits each having an input terminal coupled to one of said I/O lines, each of said sense circuits including means for generating a reference voltage, wherein during a read operation each of said sense circuits compares said reference voltage to a voltage on said I/O line and, in response thereto, provides a signal indicative of the binary state of a respective one of said cells of said array.

19. The memory of claim 18, wherein said means for generating a reference voltage comprises:
- a reference array having a plurality of reference cells similar to said cells of said array; and
- a reference circuit.

20. The memory of claim 19, wherein said reference array models said array and said reference circuit models said column decoder.

21. The memory of claim 17, wherein said cells comprise PMOS floating gate memory cells.

22. The memory of claim 19, wherein said sense circuit further comprises an equalizing circuit having a first input terminal coupled to receive said reference voltage, a second input terminal connected to said I/O line, and a control terminal coupled to receive an enable signal.

23. The memory of claim 20, wherein during a first portion of said read operation, said equalizing circuit is in a conductive state so as equalize said voltage on said I/O line with said reference voltage, and during a second portion of said read operation, said equalizing circuit is in a non-conductive state so as to isolate said I/O line from said reference voltage.

* * * * *